US012097633B2

(12) United States Patent
Okamura et al.

(10) Patent No.: US 12,097,633 B2
(45) Date of Patent: Sep. 24, 2024

(54) CUTTING METHOD

(71) Applicant: DISCO CORPORATION, Tokyo (JP)

(72) Inventors: Takashi Okamura, Tokyo (JP); Shigenori Harada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 372 days.

(21) Appl. No.: 17/392,505

(22) Filed: Aug. 3, 2021

(65) Prior Publication Data

US 2022/0055242 A1   Feb. 24, 2022

(30) Foreign Application Priority Data

Aug. 21, 2020   (JP) .................................. 2020-139870

(51) Int. Cl.
*B26D 7/08* (2006.01)
*B28D 5/04* (2006.01)
*H01L 21/78* (2006.01)
*B26D 11/00* (2006.01)

(52) U.S. Cl.
CPC .............. *B26D 7/086* (2013.01); *B28D 5/047* (2013.01); *H01L 21/78* (2013.01); *B26D 2011/005* (2013.01)

(58) Field of Classification Search
CPC ...... B28D 5/022; B28D 5/047; B28D 5/0094; H01L 21/78; B26D 7/086; B26D 2011/005
USPC ............................................................ 83/13
See application file for complete search history.

(56) References Cited

U.S. PATENT DOCUMENTS

2007/0066188 A1\*  3/2007  Nitta ...................... B28D 5/047
                                                    451/41

FOREIGN PATENT DOCUMENTS

| JP | 09216201 A | \* | 8/1997 | |
|----|-----------|----|--------|--|
| JP | 2007053234 A | | 3/2007 | |
| JP | 2007081264 A | | 3/2007 | |
| JP | 4908143 B2 | \* | 4/2012 | |
| JP | 2017143095 A | | 8/2017 | |
| WO | WO-2011134775 A1 | \* | 11/2011 | ............ B23D 51/16 |

OTHER PUBLICATIONS

Office Action issue in counterpart Japanese patent application No. 2020-139870, Mar. 26, 2024.
Office Action issue in counterpart German patent application No. 10 2021 208 635.7, dated Apr. 3, 2024.

\* cited by examiner

*Primary Examiner* — Nhat Chieu Q Do
(74) *Attorney, Agent, or Firm* — Greer Burns & Crain Ltd.

(57) ABSTRACT

Provided is a cutting method of cutting a workpiece by using a cutting apparatus including a chuck table configured to hold the workpiece and a cutting unit having a cutting blade configured to cut the workpiece held by the chuck table and an ultrasonic vibrator configured to ultrasonically vibrate the cutting blade in a radial direction of the cutting blade. The cutting method includes a holding step of holding the workpiece by the chuck table, and a cutting step of performing ultrasonic cutting that cuts the workpiece by the cutting blade vibrated ultrasonically and normal cutting that cuts the workpiece by the cutting blade not vibrated ultrasonically on the same cutting line of a plurality of cutting lines set on the workpiece.

4 Claims, 8 Drawing Sheets

CUTTING METHOD

BACKGROUND OF THE INVENTION

Field of the Invention

The present invention relates to a cutting method of cutting a workpiece by using a cutting apparatus including a cutting unit having an ultrasonic vibrator.

Description of the Related Art

A cutting apparatus is generally used in a case of cutting a plate-shaped workpiece such as a semiconductor wafer along planned dividing lines set in a lattice manner on the front surface side of the workpiece. The cutting apparatus includes a cutting unit and a chuck table disposed below the cutting unit. The cutting unit includes a cylindrical spindle. A cutting blade having an annular cutting edge is fitted to one end portion of the spindle. A rotational driving source such as a motor is coupled to another end portion of the spindle.

In the case of cutting the workpiece, first, the back surface side of the workpiece is suction-held by the holding surface of the chuck table such that the front surface side of the workpiece is exposed upward. Then, the workpiece is divided into a plurality of chips by making the cutting blade rotating at high speed cut into the workpiece along each planned dividing line. The cutting of the workpiece is relatively difficult in a case where the workpiece is formed of a brittle hard material or a material of high hardness. Accordingly, it is known that the workpiece is cut while the cutting blade is vibrated in a radial direction thereof by applying ultrasonic vibration to the cutting blade (see Japanese Patent Laid-Open No. 2007-53234, for example).

SUMMARY OF THE INVENTION

The application of the ultrasonic vibration to the cutting blade facilitates the cutting of the workpiece. However, wear of the blade is promoted correspondingly. Thus, there are problems of a shortened life of the cutting blade and an increase in replacement frequency of the cutting blade. The present invention has been made in view of such problems. It is an object of the present invention to cut a workpiece by applying ultrasonic vibration to a cutting blade and reduce excessive wear of the cutting blade.

In accordance with an aspect of the present invention, there is provided a cutting method of cutting a workpiece by using a cutting apparatus including a chuck table configured to hold the workpiece and a cutting unit having a cutting blade configured to cut the workpiece held by the chuck table and an ultrasonic vibrator configured to ultrasonically vibrate the cutting blade in a radial direction of the cutting blade, the cutting method including a holding step of holding the workpiece by the chuck table, and a cutting step of performing ultrasonic cutting that cuts the workpiece by the cutting blade vibrated ultrasonically and normal cutting that cuts the workpiece by the cutting blade not vibrated ultrasonically on the same cutting line of a plurality of cutting lines set on the workpiece.

Preferably, in the cutting step, after the ultrasonic cutting is performed on a part of the same cutting line, ultrasonic vibration is stopped, and the normal cutting is performed from a position at which the ultrasonic cutting is performed last on the same cutting line without moving the cutting blade in an indexing feed direction.

The cutting step of the cutting method according to one aspect of the present invention performs the ultrasonic cutting that cuts the workpiece by the cutting blade vibrated ultrasonically and the normal cutting that cuts the workpiece by the cutting blade not vibrated ultrasonically on the same cutting line of the plurality of cutting lines set on the workpiece. Hence, it is possible to cut the workpiece while maintaining promotion of moderate wear of the cutting blade in the ultrasonic cutting, and suppress excessive wear of the cutting blade in the normal cutting.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

First Embodiment

Figure 1:
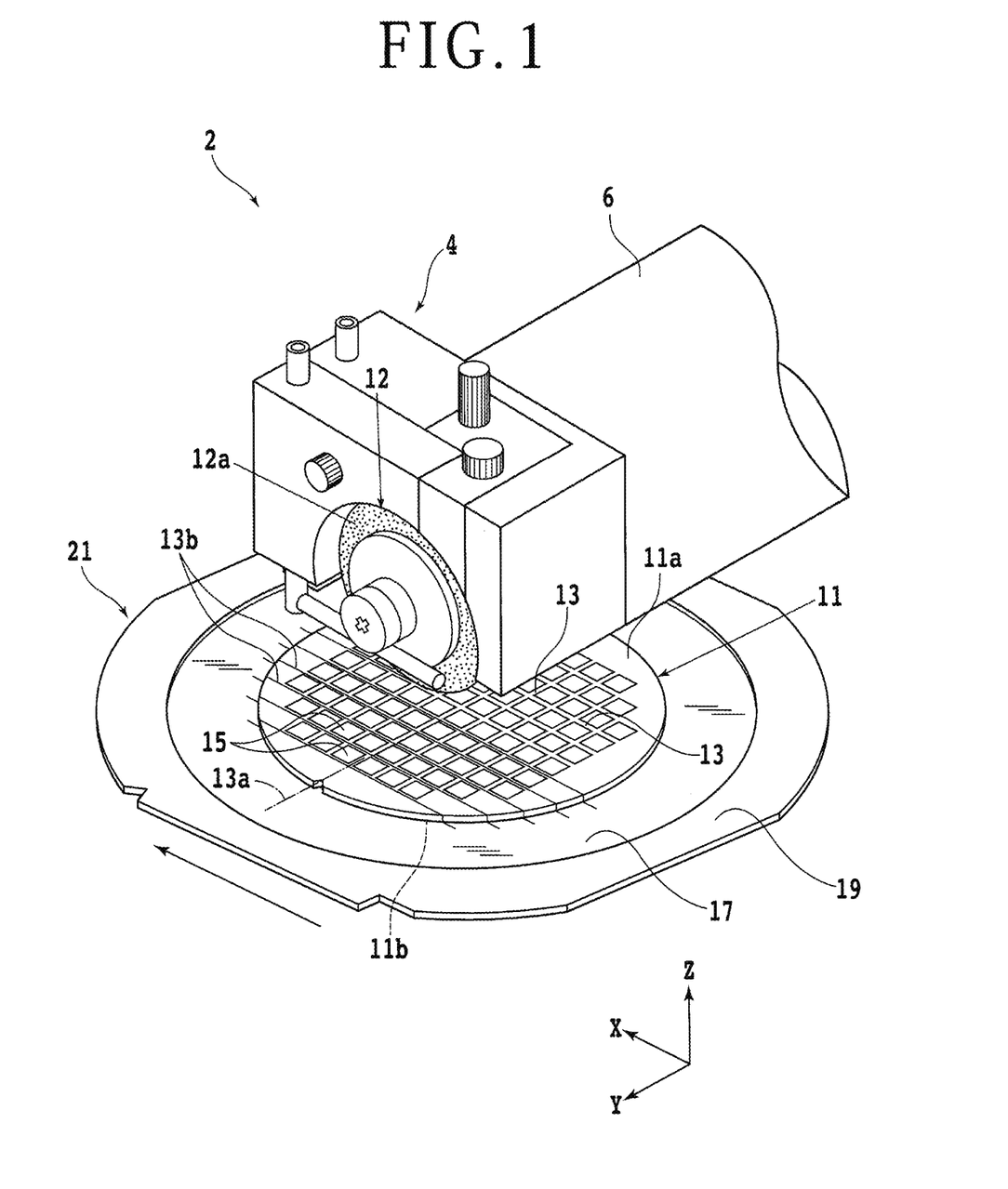
FIG. 1 is a perspective view of a cutting apparatus.
Figure 2:
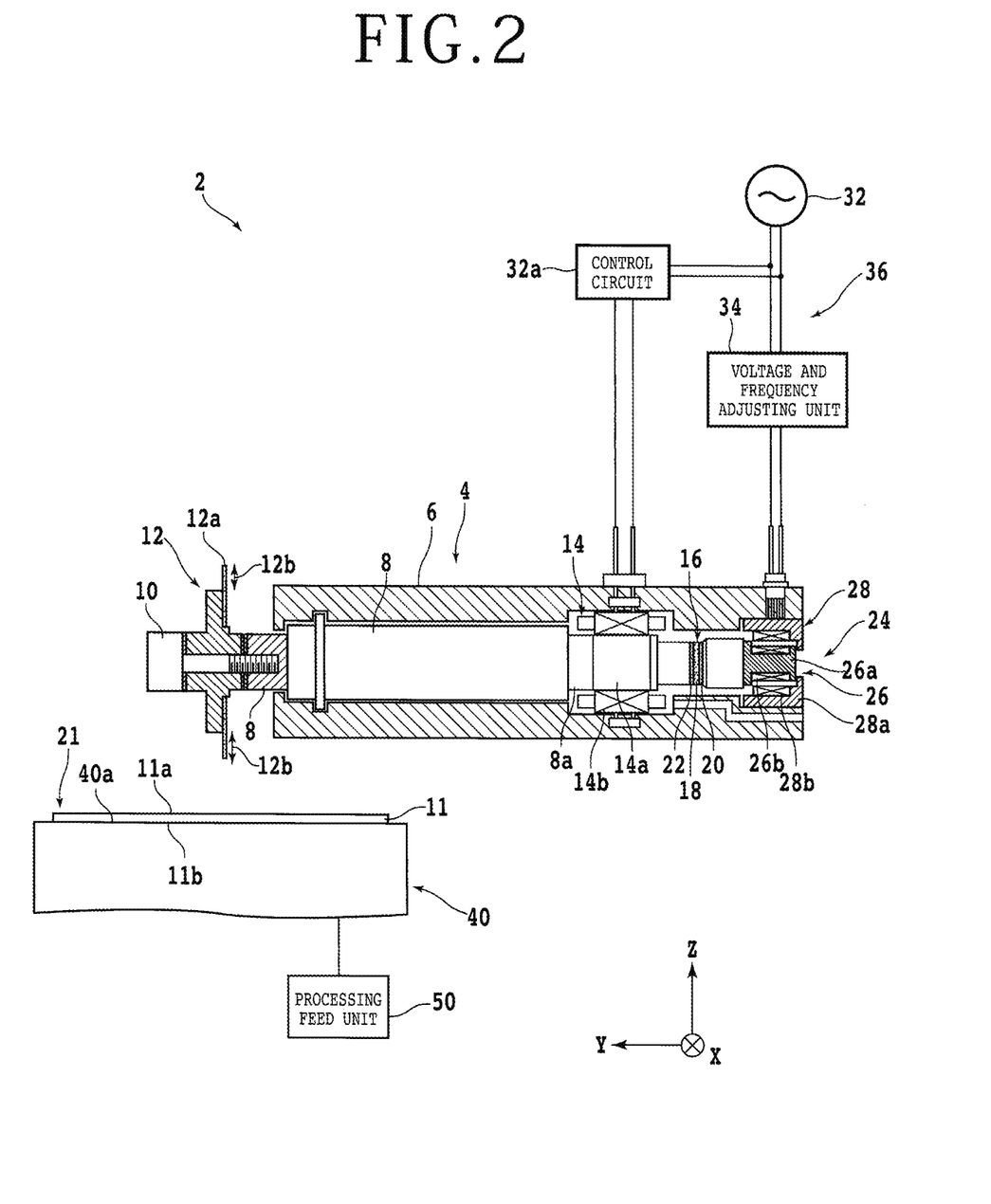
FIG. 2 is a partially sectional side view of the cutting apparatus.
Figure 3:
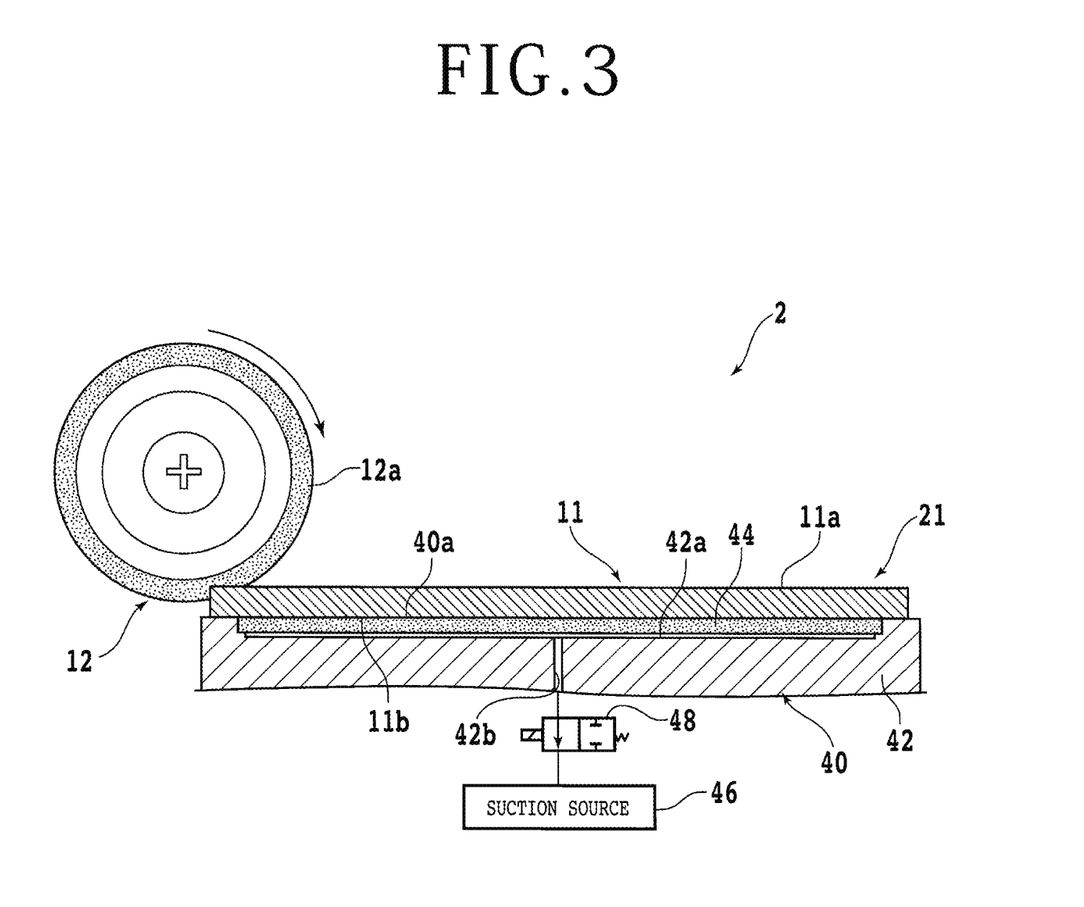
FIG. 3 is a diagram illustrating a chuck table and the like in the cutting apparatus.

A first embodiment according to one aspect of the present invention will be described with reference to the accompanying drawings. FIG. 1 is a perspective view of a cutting apparatus 2. FIG. 2 is a partially sectional side view of the cutting apparatus 2. FIG. 3 is a diagram illustrating a chuck table 40 and the like in the cutting apparatus 2. The cutting apparatus 2 includes a cutting unit 4 that cuts a workpiece 11. The cutting unit 4 has a cylindrical spindle housing 6 disposed substantially in parallel with a Y-axis direction (indexing feed direction). A part of a cylindrical spindle 8 is housed in a rotatable manner within the spindle housing 6 (see FIG. 2).

A threaded hole is formed in one end portion of the spindle 8. A screw 10 fixed to the threaded hole fits a cutting blade 12 to the one end portion of the spindle 8. The cutting blade 12 has an annular cutting edge 12a on an outer circumferential portion thereof. The cutting edge 12a is formed by abrasive grains and a bonding material that fixes the abrasive grains. Another end portion of the spindle 8 is provided with a cylindrical motor fitting portion 8a. A rotor 14a of a motor 14 that rotates the spindle 8 is coupled to the motor fitting portion 8a. The rotor 14a, for example, has a permanent magnet.

A stator coil 14b fixed to the spindle housing 6 is disposed in a separated manner on an outer circumference side of the rotor 14a. The rotor 14a rotates when the stator coil 14b is supplied with alternating-current power from an alternating-current power supply 32 to be described later via a control circuit 32a. Incidentally, the control circuit 32a adjusts a current supplied to the stator coil 14b. Operation of the control circuit 32a is controlled by a control unit (not illustrated) of the cutting apparatus 2. An ultrasonic vibrator 16 that applies ultrasonic vibration to the cutting blade 12 is coupled to an opposite side of the motor 14 from the motor fitting portion 8a.

The ultrasonic vibrator 16 has an annular piezoelectric element 18 polarized in the axial direction of the spindle 8. The piezoelectric element 18 is formed by a piezoelectric ceramic such as barium titanate, lead zirconate titanate, or lithium tantalate. The piezoelectric element 18 is sandwiched by annular electrode plates 20 and 22. The annular electrode plate 20 is fixed to one polarized surface of the piezoelectric element 18, and the annular electrode plate 22 is fixed to another polarized surface of the piezoelectric element 18. A rotary transformer 24 is coupled to an opposite side of the ultrasonic vibrator 16 from the motor 14. The rotary transformer 24 has a cylindrical power receiving unit 26. The power receiving unit 26 includes a rotary core 26a coupled to the spindle 8 via the ultrasonic vibrator 16 and a power receiving coil 26b wound around an outer circumferential portion of the rotary core 26a.

An annular feeding unit 28 is disposed in a separated manner on the outside of the power receiving unit 26 so as to surround the power receiving unit 26. The feeding unit 28 includes an annular stator core 28a disposed on the outer circumference side of the power receiving coil 26b and a feeding coil 28b disposed on the inner circumferential side surface of the stator core 28a. The feeding coil 28b is supplied with power from the alternating-current power supply 32 via a voltage and frequency adjusting unit 34. The voltage and frequency adjusting unit 34 is a function generator, for example. Operation of the voltage and frequency adjusting unit 34 is controlled by the control unit (not illustrated) of the cutting apparatus 2.

The alternating-current power supply 32 and the voltage and frequency adjusting unit 34 constitute a power supply unit 36 that supplies the feeding unit 28 with alternating-current power having a predetermined frequency and a predetermined voltage. When the feeding coil 28b is supplied with power, alternating-current voltage is applied to the power receiving coil 26b in a noncontact manner. The electrode plate 20 is connected to one end of the power receiving coil 26b, and the electrode plate 22 is connected to another end of the power receiving coil 26b. Thus, the alternating-current voltage applied to the power receiving coil 26b is applied to the electrode plates 20 and 22. When the alternating-current voltage of an ultrasonic frequency is applied to the electrode plates 20 and 22, the ultrasonic vibrator 16 vibrates at the ultrasonic frequency in the axial direction of the spindle 8. The vibration in the axial direction of the spindle 8 is converted into vibration in a radial direction 12b of the cutting blade 12 at one end portion of the spindle 8. The cutting blade 12 vibrates at the ultrasonic frequency in the radial direction 12b. That is, the cutting blade 12 performs ultrasonic vibration.

The chuck table 40 is disposed below the cutting unit 4. The chuck table 40 has a disk-shaped frame body 42 (see FIG. 3). A disk-shaped recessed portion 42a is formed in an upper portion of the frame body 42. A disk-shaped porous plate 44 formed by a porous ceramic is fixed to the recessed portion 42a. The upper surface of the porous plate 44 and the upper surface of the frame body 42 are substantially flush with each other, and constitute a holding surface 40a of the chuck table 40. A central portion of the recessed portion 42a is connected with one end of a flow passage 42b. Another end of the flow passage 42b is connected with a suction source 46 such as an ejector. In addition, a solenoid valve 48 is provided between the one end and the other end of the flow passage 42b. When the solenoid valve 48 is in an opened state, a negative pressure occurring in the suction source 46 is transmitted to the porous plate 44 through the flow passage 42b, and the negative pressure occurs in the upper surface of the porous plate 44.

In the following, description will be made of the workpiece 11 held by the holding surface 40a. As illustrated in FIG. 1, the disk-shaped workpiece 11 is formed by a semiconductor wafer such as silicon, and a plurality of planned dividing lines 13 (cutting lines) are set in a lattice manner on a front surface 11a side of the workpiece 11. A device 15 such as an integrated circuit (IC) or a large scale integration (LSI) is formed in each of regions demarcated by the plurality of planned dividing lines 13. However, there are no limitations on the kind, material, size, shape, structure, and the like of the workpiece 11. The workpiece 11 may be a wafer or a substrate formed by a compound semiconductor other than silicon (GaN, SiC, or the like), a glass, a ceramic, a resin, a metal, or the like. In addition, there are no limitations on the kind, quantity, shape, structure, size, arrangement, and the like of the devices 15 formed on the workpiece 11. The devices 15 may not be formed on the workpiece 11.

A dicing tape 17 made of a resin is affixed to a back surface 11b side of the workpiece 11. The dicing tape 17 has a circular shape, and has a diameter larger than the diameter of the workpiece 11. The workpiece 11 is affixed to a central portion of the dicing tape 17. One surface of an annular frame 19 formed by a metal is affixed to an outer circumferential portion of the dicing tape 17. A frame unit 21 is thus formed in which the workpiece 11 is supported by the frame 19 via the dicing tape 17. Incidentally, in FIG. 2 and FIG. 3, the dicing tape 17 and the frame 19 are omitted.

A θ table (not illustrated) that rotates the chuck table 40 about a rotational axis substantially parallel with a Z-axis direction (a height direction or an upward-downward direction) is provided below the chuck table 40. The θ table is supported by a processing feed unit 50 (see FIG. 2). The processing feed unit 50 is a moving mechanism of a ball screw type. The processing feed unit 50 moves the chuck table 40 and the θ table along an X-axis direction (processing feed direction). Incidentally, the X-axis direction, the Y-axis direction, and the Z-axis direction are directions orthogonal to one another.

Figure 4:
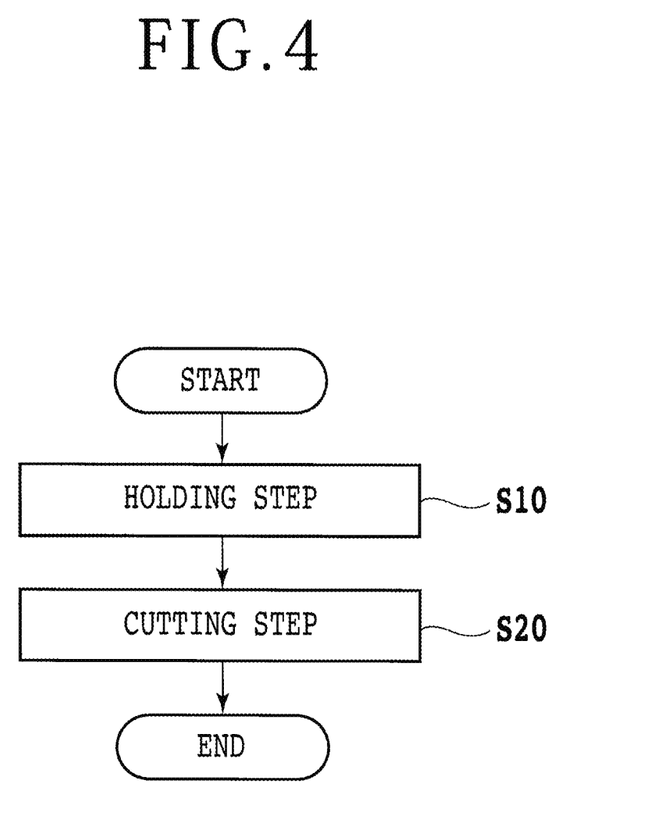
FIG. 4 is a flowchart illustrating a cutting method.

Description will next be made of a cutting method of cutting the workpiece 11 by using the cutting apparatus 2. FIG. 4 is a flowchart illustrating the cutting method. First, as illustrated in FIG. 3, the holding surface 40a of the chuck table 40 holds the back surface 11b side of the workpiece 11 (holding step S10). After the holding step S10, the workpiece 11 is cut (cutting step S20). In the cutting step S20, first, the planned dividing lines 13 are detected by using a camera unit (not illustrated), and the orientation of the workpiece 11 is adjusted by the θ table (not illustrated) such that one planned dividing line 13 is substantially parallel with the X-axis direction. Thereafter, the cutting blade 12 rotating at high speed is positioned on an extension of the one planned dividing line 13, and a lower end of the cutting blade 12 is positioned at a height between the back surface 11b and the holding surface 40a. Further, the ultrasonic vibrator 16 is operated.

Next, as illustrated in FIG. 1, the chuck table 40 is moved in the X-axis direction, and ultrasonic cutting is performed which cuts the workpiece 11 by the cutting blade 12 in a state of being vibrated at the ultrasonic frequency from one side to a predetermined position 13a on the one planned dividing line 13. Incidentally, at a time of the cutting, cutting water such as pure water is supplied from a cutting water supply nozzle to a processing point. When the ultrasonic cutting is performed as far as the predetermined position 13a, the cutting unit 4 is indexing-fed by a predetermined length. Then, on another planned dividing line 13 adjacent in the Y-axis direction to the one planned dividing line 13 in which a cut groove 13b is formed, the ultrasonic cutting is similarly performed from one side to the predetermined position 13a on the other planned dividing line 13.

After cut grooves 13b are similarly formed by the ultrasonic cutting along all of the planned dividing lines 13 along one direction, the feeding of the ultrasonic vibrator 16 is stopped, and the rotating cutting blade 12 is lowered and cut into the predetermined position 13a of the planned dividing line 13 that has been cut first. Then, normal cutting is performed which cuts the workpiece 11 by the cutting blade 12 in a state of not being vibrated at the ultrasonic frequency from the predetermined position 13a to another side of the planned dividing line 13. Similarly, the normal cutting is performed for the remaining planned dividing lines 13 from the predetermined position 13a to other sides of the planned dividing lines 13.

After cut grooves 13b are formed along all of the planned dividing lines 13 along the one direction, the chuck table 40 is rotated by 90 degrees, and the planned dividing lines 13 not cut yet are set substantially in parallel with the X-axis direction. Then, the ultrasonic cutting and the normal cutting are similarly performed for all of the planned dividing lines 13 not cut yet. The workpiece 11 is thus divided into a plurality of chips. The cutting step S20 according to the present embodiment forms a cut groove 13b along each planned dividing line 13 by performing the ultrasonic cutting and the normal cutting on the same planned dividing line 13 (same cutting line). Incidentally, the same planned dividing line 13 (same cutting line) refers to one planned dividing line 13 (one cutting line) set continuously in a linear manner. The ultrasonic cutting can cut the workpiece 11 while maintaining promotion of moderate wear of the cutting blade 12. On the other hand, the normal cutting does not vibrate the cutting blade 12, and can therefore suppress excessive wear of the cutting blade 12. Hence, it is possible to suppress excessive wear of the cutting blade 12 while maintaining promotion of moderate wear of the cutting blade 12.

Example

Figure 5:
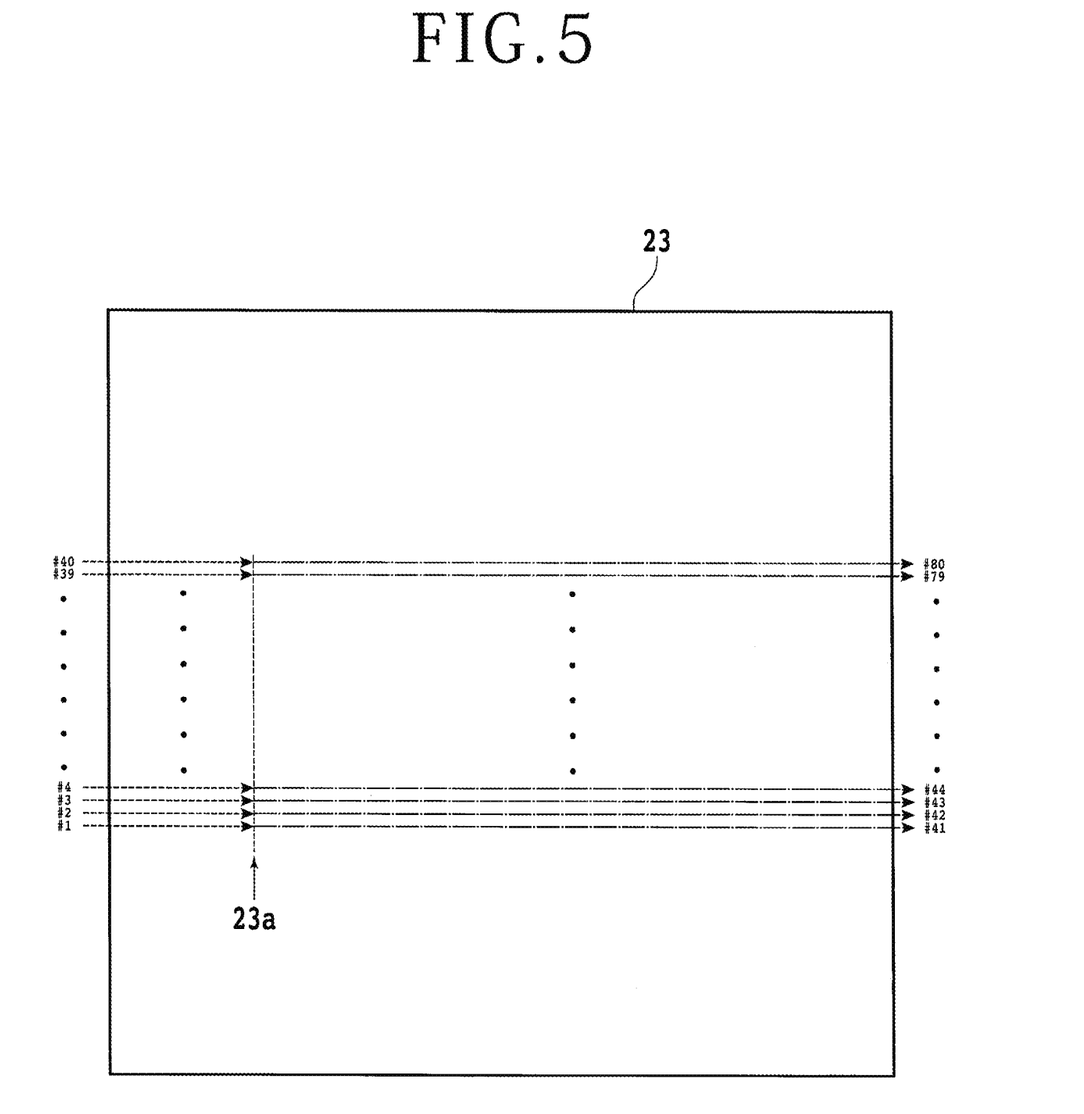
FIG. 5 is a diagram illustrating cutting order in the cutting method in an example.
Figure 6:
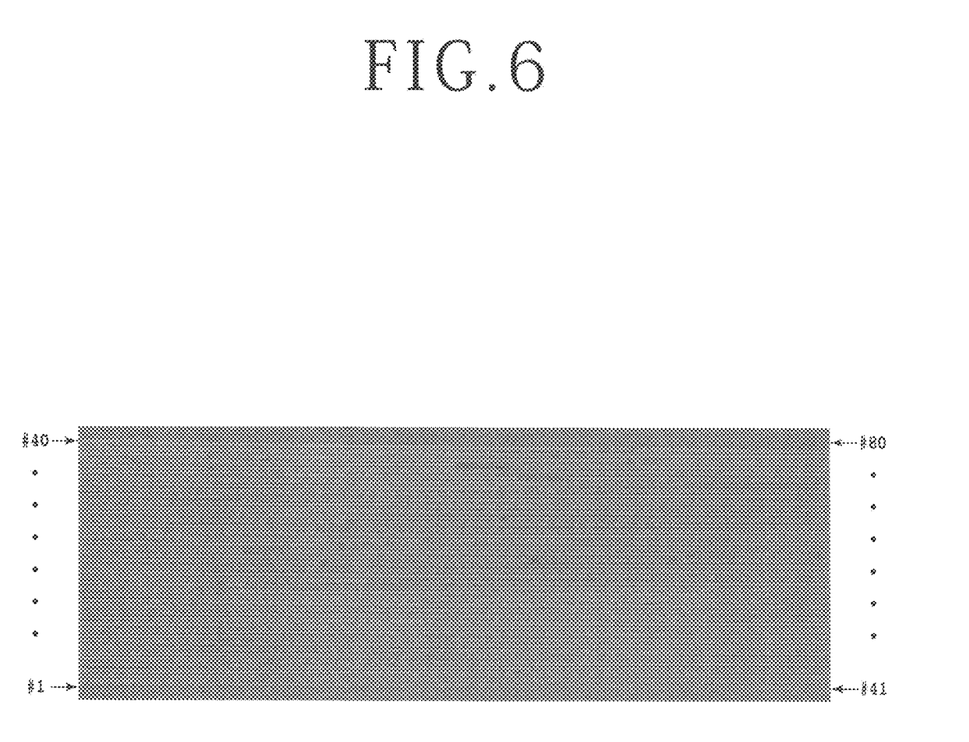
FIG. 6 is an image of a glass substrate after being cut by the cutting method in the example.

An example will next be described. FIG. 5 is a diagram illustrating cutting order in the cutting method in the example. FIG. 6 is an image of a glass substrate 23 (made of soda glass) after being cut by the cutting method in the example. Incidentally, in FIG. 6, parts where no cut grooves are formed are omitted. The present example used a square plate-shaped glass substrate 23 having one side of 100 mm, another side of 100 mm, and a thickness of 0.5 mm. Forty cutting lines were set so as to be along one side direction of the glass substrate 23. In addition, the cutting lines were set discretely in another side direction of the glass substrate 23.

In particular, in the present example, the ultrasonic cutting was performed from one end of one side to a predetermined position 23a at a position of 15 mm in order of #1 to #40 (broken lines), and the normal cutting was next performed from the predetermined position 23a to another end of the one side in order of #41 to #80 (alternate long and short dashed lines) (see FIG. 5). Incidentally, cutting lines indicated by #1 and #41 are an identical cutting line, and cutting lines indicated by #N and #(N+40) are also an identical cutting line (incidentally, N is a natural number of 2 to 40 both inclusive).

At a time of cutting, the cutting blade 12 was rotated at 20000 rpm, and the chuck table 40 suction-holding the glass substrate 23 was processing-fed at 20 mm/s. In addition, at the time of the cutting, pure water (not illustrated) was supplied as cutting water from the cutting water supply nozzle to the processing point at 2.5 l/min. A cut groove having a depth of 430 μm was thus formed in each cutting line (see FIG. 6). In the present example, the cutting edge 12a of the cutting blade 12 was worn by 0.9 μm in the radial direction 12b when the formation of the 40 cut grooves was completed.

First Comparative Example

Figure 7A:
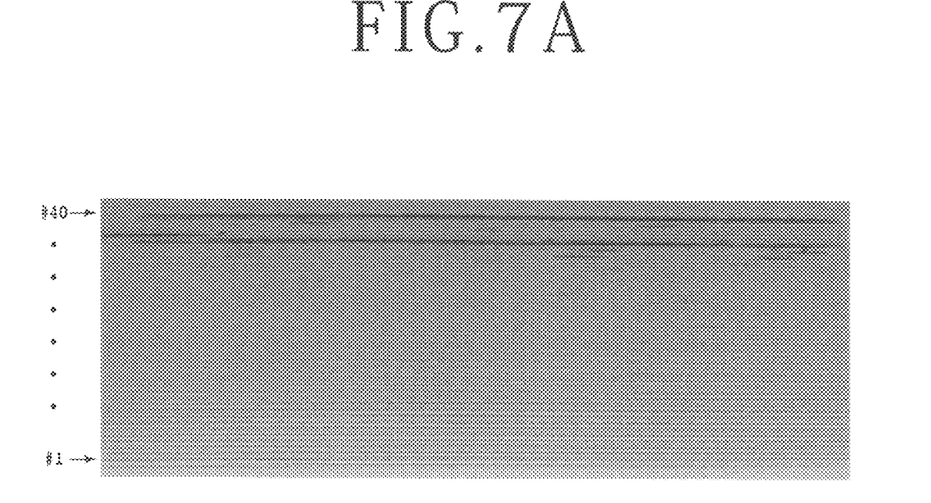
FIG. 7A is an image of the glass substrate after being cut by a cutting method according to a first comparative example.

FIG. 7A is an image of the glass substrate 23 after being cut by a cutting method according to a first comparative example. Incidentally, in FIG. 7A, parts where no cut grooves are formed are omitted. In the first comparative example, 40 cut grooves were discretely formed in the other side direction of the glass substrate 23 by performing the normal cutting from one end to another end of the one side of the glass substrate 23 in order of #1 to #40. The rotational speed of the cutting blade 12 and the processing feed speed of the chuck table 40 were set to be the same as in the foregoing example, and cutting water was also supplied similarly. When the formation of the 40 cut grooves was completed, the cutting edge 12a of the cutting blade 12 was worn by 0.5 μm in the radial direction 12b. An amount of wear of the cutting edge 12a was reduced as compared with the example. However, as is clear from comparison between FIG. 7A and FIG. 6, in the first comparative example, noticeable processing defects occurred in a rear part of the cutting order. The processing defects are illustrated in black in FIG. 7A. The occurrence of the processing defects is estimated to be caused by dulling of the abrasive grains because the bonding material is not worn appropriately.

Second Comparative Example

Figure 7B:
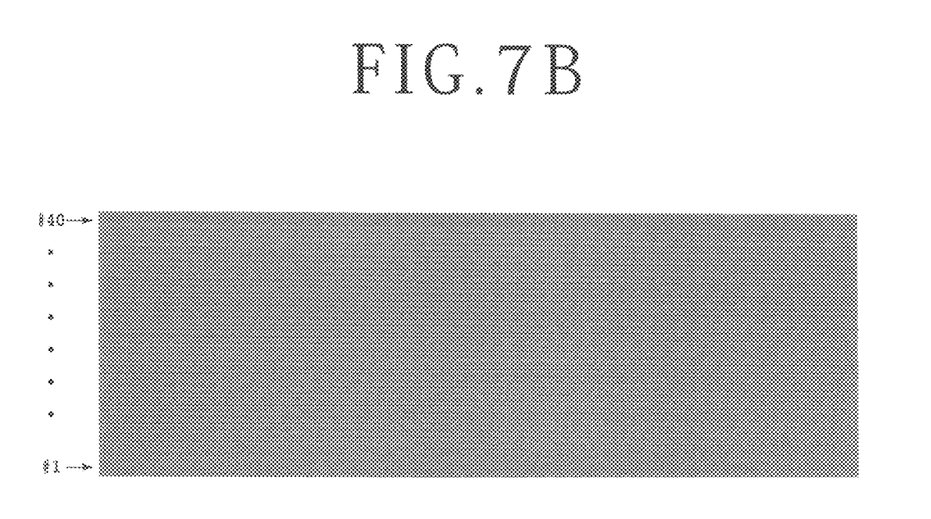
FIG. 7B is an image of the glass substrate after being cut by a cutting method according to a second comparative example.

FIG. 7B is an image of the glass substrate 23 after being cut by a cutting method according to a second comparative example. Incidentally, in FIG. 7B, parts where no cut grooves are formed are omitted. In the second comparative example, 40 cut grooves were discretely formed in the other side direction of the glass substrate 23 by performing the ultrasonic cutting from one end to another end of one side of the glass substrate 23 in order of #1 to #40. The rotational speed of the cutting blade 12 and the processing feed speed of the chuck table 40 were set to be the same as in the foregoing example, and cutting water was also supplied similarly. As is clear from comparison between FIG. 7B and FIG. 6, in the second comparative example, almost no processing defects occurred. However, an amount of wear of the cutting edge 12a was increased significantly as compared with the example. Specifically, at a time of completion of the formation of the 40 cut grooves, the cutting edge 12a of the cutting blade 12 was worn by 2.55 μm in the radial direction 12b. From comparison of the example with the first and second comparative examples, it can be said that the cutting method of the example can maintain promotion of moderate wear of the cutting blade 12 and suppress excessive wear of the cutting blade 12.

Second Embodiment

Figure 8:
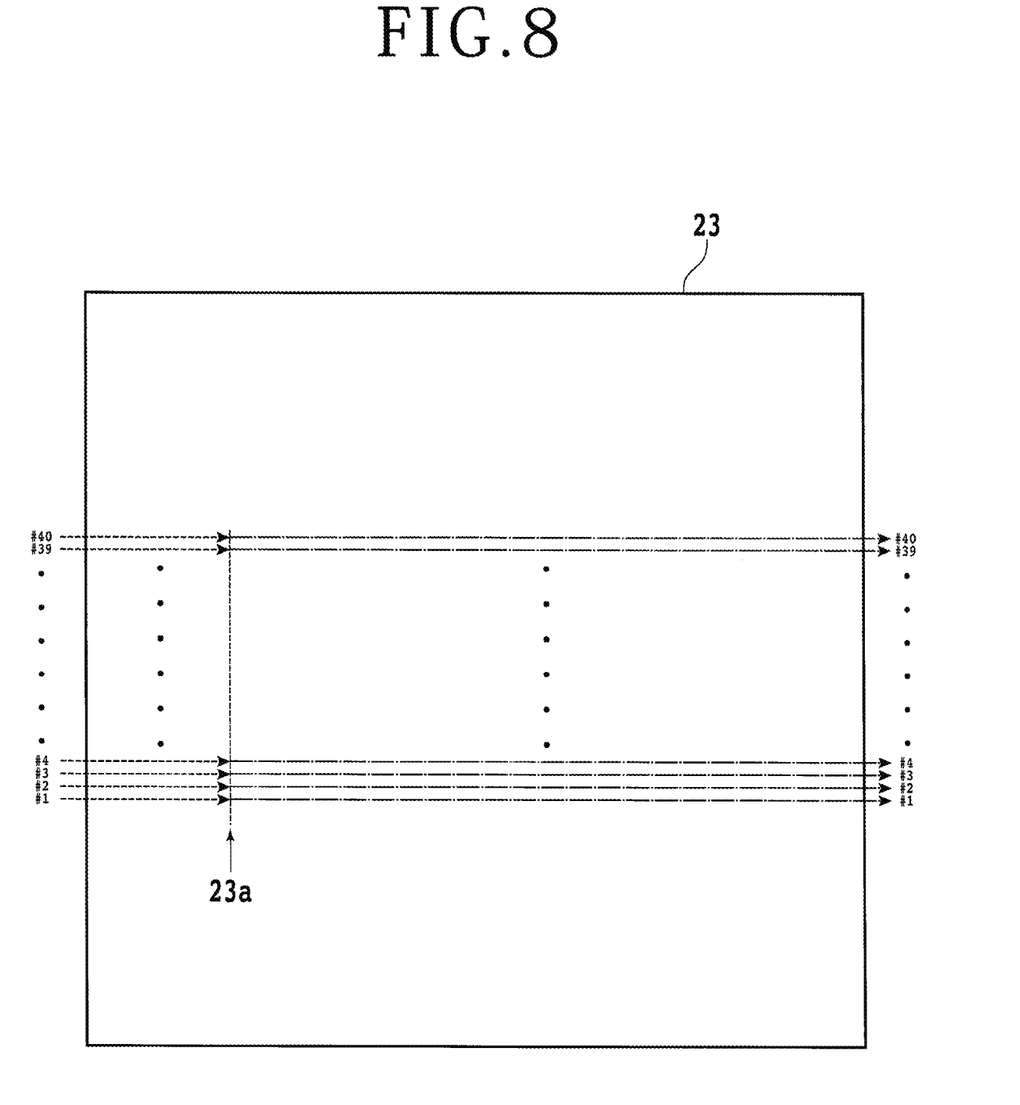
FIG. 8 is a diagram illustrating cutting order in a cutting method according to a second embodiment.

A second embodiment will next be described. FIG. 8 is a diagram illustrating cutting order in a cutting method according to the second embodiment. The second embodiment performs indexing feed after performing cutting from one end to another end of one cutting line, and performs cutting from one end to another end of one adjacent cutting line. However, as indicated by broken lines, the second embodiment first performs the ultrasonic cutting from one end of a glass substrate 23 to a predetermined position 23a (on a part of the same cutting line), and thereafter stops the ultrasonic cutting.

Then, as indicated by alternate long and short dashed lines, the normal cutting is performed from the predetermined position 23a (position at which the ultrasonic cutting was performed last on the same cutting line) to another end of the glass substrate 23 without the cutting blade 12 being moved in the Y-axis direction. By thus performing the ultrasonic cutting and the normal cutting on the same cutting line, it is possible to cut the glass substrate 23 while maintaining promotion of moderate wear of the cutting blade 12 in the ultrasonic cutting, and suppress excessive wear of the cutting blade 12 in the normal cutting.

Moreover, structures, methods, and the like according to the foregoing embodiments can be modified and implemented as appropriate without departing from the objective scope of the present invention. For example, the above-described workpiece 11 can be cut according to the cutting method in accordance with the second embodiment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting method of cutting a semiconductor wafer workpiece, the cutting method comprising:
    a providing step of providing a cutting apparatus including a chuck table configured to hold the workpiece and a cutting unit having a cutting blade configured to cut the workpiece held by the chuck table and an ultrasonic vibrator configured to ultrasonically vibrate the cutting blade in a radial direction of the cutting blade;
    a holding step of holding the workpiece by the chuck table;
    a cutting step of performing ultrasonic cutting that cuts the workpiece by the cutting blade vibrated ultrasonically and a rotational cutting that cuts the workpiece by the cutting blade not vibrated ultrasonically on a plurality of cutting lines set on the workpiece, each cutting line of the plurality of cutting lines extending in one of an X-axis direction and a Y-axis direction, each cutting line of the plurality of cutting lines having a first portion extending from a first position to a predetermined position and a second portion extending from the predetermined position to a second position; and
    wherein, in the cutting step, the ultrasonic cutting is performed in each of the first portions, and the rotational cutting is performed in each of the second portions; and
    wherein the first portion and the second portion extend along the same axis extending in one of the X-axis direction or Y-axis direction.

2. The cutting method according to claim 1, wherein in the cutting step, the ultrasonic cutting is performed in the first portion extending from the first position to the predetermined position on a selected cutting line of the plurality of cutting lines, ultrasonic vibration of the cutting blade is stopped, and the rotational cutting is performed in the second portion extending from the predetermined position to the second position on the selected cutting line of the plurality of cutting lines without moving the cutting blade in an indexing feed direction.

3. The cutting method according to claim 2, wherein after the cutting step is completed for the selected cutting line of the plurality of cutting lines, the cutting step is repeated for a second selected_cutting line of the plurality of the cutting lines.

4. The cutting method according to claim 1, wherein in the cutting step, the ultrasonic cutting is first performed in the each of the first portions of the plurality of cutting lines, and then the rotational cutting is next performed in each of the second portions of the plurality of cutting lines.

* * * * *